United States Patent
Rainhart et al.

[19]

[11] Patent Number: 5,933,121
[45] Date of Patent: Aug. 3, 1999

[54] ANTENNA ARRAY FOR SENSING SIGNALS ON CONDUCTORS

[75] Inventors: Robert L. Rainhart, Kissimmee, Fla.; Larry Davis, Golden, Colo.; Charles M. Newton, Palm Bay; Theodore R. Blumstein, Vero Beach, both of Fla.

[73] Assignee: Harris Corporation, Palm Bay, Fla.

[21] Appl. No.: 09/056,482

[22] Filed: Apr. 7, 1998

[51] Int. Cl.$^6$ .................................................. H01Q 1/40
[52] U.S. Cl. .................. 343/873; 343/895; 343/700 MS; 324/127; 324/522
[58] Field of Search ..................... 343/873, 872, 343/895, 700 MS, 841, 853, 789; 324/127, 522

[56] References Cited

U.S. PATENT DOCUMENTS

| | | | |
|---|---|---|---|
| 4,724,381 | 2/1988 | Crimmins | 324/127 |
| 4,754,218 | 6/1988 | Wagner et al. | 324/127 |
| 4,794,329 | 12/1988 | Schweitzer, Jr. | 324/127 |
| 4,804,917 | 2/1989 | Miller et al. | 324/95 |
| 5,140,614 | 8/1992 | Buzbee et al. | 375/75 |
| 5,276,457 | 1/1994 | Agarwall | 343/789 |
| 5,315,753 | 5/1994 | Jensen et al. | 29/600 |
| 5,378,992 | 1/1995 | Murphy | 324/627 |
| 5,436,554 | 7/1995 | Decker, Jr. | 324/66 |
| 5,456,778 | 10/1995 | Fukuta et al. | 156/89 |
| 5,552,702 | 9/1996 | Wissman | 324/127 |
| 5,565,783 | 10/1996 | Lau et al. | 324/522 |
| 5,818,398 | 10/1998 | Tsuru et al. | 343/895 |

*Primary Examiner*—Don Wong
*Assistant Examiner*—Jennifer H. Malos
*Attorney, Agent, or Firm*—Allen, Dyer, Doppelt, Milbrath & Gilchrist, P.A.

[57] ABSTRACT

An apparatus senses signals on conductors and includes a ceramic sensor body. A plurality of antenna elements are formed in the ceramic sensor body. Each antenna element includes a conductor sensing end and forms an array having a substantially planar face that is to be placed adjacent to conductors to be sensed. Each of the antenna elements further comprises a central electrode and a surrounding shield electrode spaced from the central electrode. A signal processor is connected to each antenna element and receives the signal output from each antenna element and processes the received signals for determining the presence of signals passing to the conductors. The central electrode and surrounding shield electrode are formed of a hardened, conductive paste received within the ceramic sensor body.

51 Claims, 12 Drawing Sheets

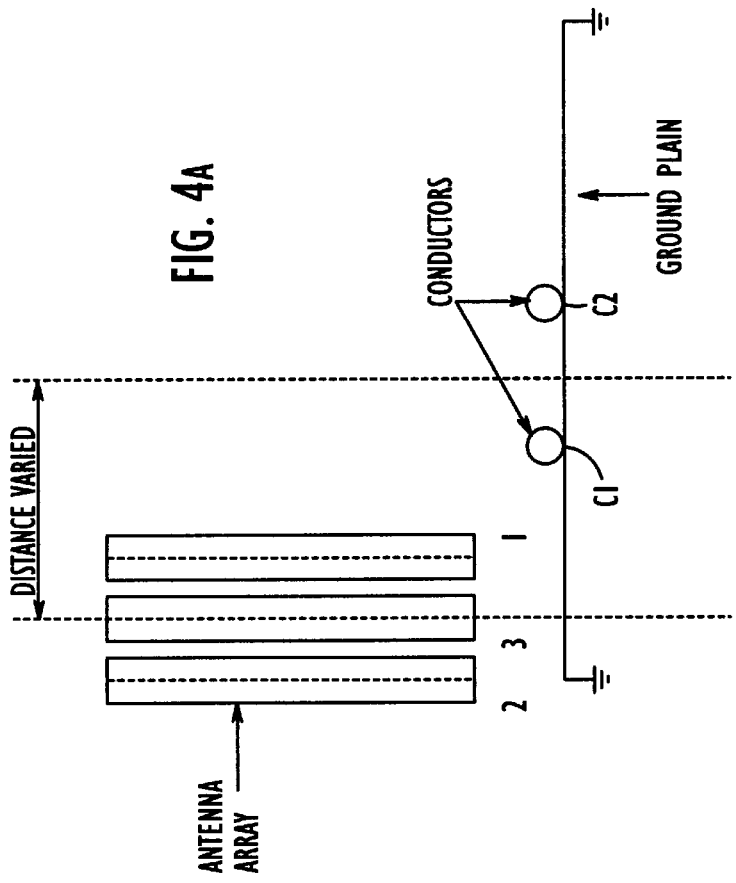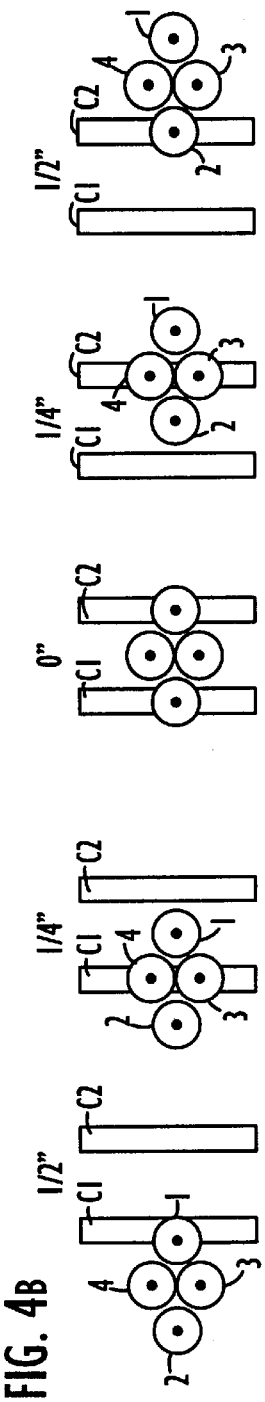
FIG. 4A
FIG. 4B

ANTENNA ARRAY FOR SENSING SIGNALS ON CONDUCTORS

FIELD OF THE INVENTION

This invention relates to sensing signals on conductors, and more particularly, this invention relates to a sensor that is used for determining the presence of signals passing through conductors, and the method of forming the sensor.

BACKGROUND OF THE INVENTION

With the vast increase in telecommunications and other communication systems over the last few decades, the use of different transmission lines using multiple conductors such as parallel conductors has increased. These communication systems include both standard copper wires and also optical fibers, which carry many more signals than the more conventional copper wire transmission systems. Much of the equipment and lines that are now in place were already in place some years ago, and include copper twisted wire pairs and optical fiber transmission lines that use digital carriers in the multiplexed scheme. When multiplexed signals are used on optical fiber, digital carrier signals are generated, and any information is digitized and forwarded over the wires on the digital carrier such as in the common T-1 and T-2 systems using pulse code modulation carriers.

In emergency repair operations or periodical maintenance and testing operations, it is necessary to sense any signals on multiple lines, such as those conductor lines that are in parallel, without disturbing communications. Some existing solutions have used break-out boxes and data acquisition techniques that involve disturbing the line or interrupting communications. These techniques have been found inadequate because it is not practical to disturb the line or interrupt communications.

Some improved devices allowed non-intrusive digital carrier signal detection, but required complicated processing circuitry. These systems did not provide information about the relative strength or identity of the digital carrier. For example, U.S. Pat. No. 5,140,614 to Buzbee, et al. discloses the system where conductive or capacitive loading can be used to detect a conductor that is in service, without disrupting service. The patent discloses a non-intrusive testing system for a digital carrier, including a balanced capacitive sensing probe coupled to a heterodyne circuit. The capacitive sensing probe is inserted between two conductor wires. The signal is obtained by capacitive or inductive coupling and is filtered to pass only the carrier signal. This signal is amplified and if the signal exceeds a threshold level, an audio tone is generated. The only information conveyed by the scheme is that the carrier signal has exceeded threshold level. The relative strength of a signal in the carrier identity is undetectable and remains unknown.

Another prior art non-intrusive testing device is disclosed in U.S. Pat. No. 5,552,702 to Wissman. This patent discloses a ferrite core used as a portion of a non-intrusive signal probe for telephone signals on a twisted wire pair. The system not only allows the detection of digital carrier signals, but also the detection of audible frequency tracing tones. A telephone repair person uses the invention to determine which wire pairs are in service by examining which wire pairs are conducting digital carrier signals. However, many of the problems associated with determining which wire is carrying signals is the cross-talk coupled signal noise. The device in the '702 patent examines which wire pairs are conducting digital carrier signals. Because the volume of an audible tone is proportional to the strength of the carrier signal, the volume of the audible tone can be used to determine if a pair is probed, in service and primarily carrying a cross-talk coupled signal. However, the system could be limited because a single probe is used to detect which lines are active. Additionally, the system is complicated and not amenable to miniaturization Many of these types of prior-art devices are very large, and not applicable to sensing embedded materials, or used in an application which requires sensing signals in a limited space. Additionally, the use of one sensor probe could be limited due to cross-talk existing between lines, which worsens if more parallel lines are added. Eliminating the effect of cross-talk can be essential to determine the actual presence of a signal, and is difficult if there are more than two parallel lines. Thus, the sensor sometimes must have many different elements to account for any cross-talk, especially when conductors are closely spaced, as with parallel spaced conductor lines. Thus, a sensor should have a number of different elements which would allow for more signal comparison across a parallel cable. This is especially necessary when testing on a small scale.

U.S. Pat. No. 5,315,753 to Jensen, et al. discloses an antenna structure having a number of different elements to form a patch antenna element. Although the device is not used for sensing signals, it does disclose a method of forming a structure having a plurality of antenna elements forming an antenna array. The patch antenna can be adapted for small scale use and comprises a plurality of dielectric layers, with portions of the antenna formed by a conductive paste. The device is fired to remove the binder and solidify the structure. The patch antenna conductor portion and a ground plane may be formed by silk screening the conductive paste. The antenna can be used for different types of applications including a ground positioning receiver. The patent further discloses the step of vertically stacking conductive antenna elements to permit operation at different frequencies.

It is evident that none of the prior-art devices allow a sensor that can be adapted to small scale, but also allows non-intrusive testing of conductors where the noise, such as the cross-talk, can be distinguished from the conductors carrying the regular signals.

SUMMARY OF THE INVENTION

It is therefore an object of the present invention to provide a sensor for non-intrusive testing of conductors, which can be used on a small scale.

It is still another object of the present invention to provide a method of making a sensor for non-intrusive sensing of conductors, which allows for the production of small devices.

It is still another object of the present invention to provide a sensor for determining signals on a plurality of conductor lines that distinguishes between cross-talk among the lines.

In accordance with the present invention, the present invention includes an apparatus for sensing signals on conductors that includes a ceramic sensor body. A plurality of antenna elements are formed in the ceramic sensor body. Each antenna element includes a conductor sensing end and is positioned to form an array having a substantially planar face that is to be placed adjacent to the conductors to be sensed. Each of the antenna elements further comprises a central electrode and a surrounding shield electrode spaced from the central electrode. A signal processor, such as a signal processing chip, is connected to each antenna element and receives the signal output from each antenna element.

The signal processor processes the received signals for determining the presence of signals passing through conductors, such as small-scale parallel conductors placed on a chip.

In accordance with one aspect of the present invention, the central electrode and the surrounding shield electrode are formed of a hardened, conductive paste received within the ceramic sensor body. The signal processing circuit can further comprise a signal processing integrated circuit. Means can mount the signal processing integrated circuit on the sensor body. The sensor body can further comprise a substantially planar mounting surface on which the signal processing integrated circuit is mounted.

In still another aspect of the present invention, a central electrode of each antenna element can include a first and second end. The first end have an enlarged diameter to be placed adjacent to conductors to be sensed. The signal processor can also comprise a spectrum analyzer with an amplifier connected to the output of the various antenna elements.

In still another aspect of the present invention, the ceramic sensor body is formed from a plurality of stacked sheets of ceramic green tape that has been cured by heating. The apparatus further comprises a means for grounding the surrounding shield electrode. The antenna elements are preferably positioned in linear rows, with each row offset from each other. The central electrode is preferably spiral configured.

The sensor of the present invention senses signals on conductors and comprises a ceramic sensor body and a plurality of antenna elements formed in the ceramic sensor body and positioned to form an array. The plurality of antenna elements include a conductor sensing end forming a substantially planar sensor face that is to be placed adjacent to conductors to be sensed. The antenna elements further comprise a central electrode and a surrounding shield electrode spaced from the central electrode.

A method aspect of the present invention allows sensing of signals on conductors and comprises the steps of passing a plurality of antenna elements over the conductors to be sensed. Each of the antenna elements are positioned to form an array, and have a central electrode and surrounding electrode. The method further comprises receiving the signal output within a signal processor from each antenna element as the antenna elements pass over the conductors. The received signal output from each antenna element is processed to determine the presence of signals passing through the conductor. The method further comprises the step of correlating the processed signal output from each antenna element to determine the data passing through each conductor.

The invention also comprises a method of forming a sensor adapted for sensing signals on conductors, which comprises the steps of forming a plurality of antenna element openings in a plurality of green tape ceramic sheets. Each antenna element opening comprises a sensor opening and annular openings surrounding the central opening. Successive green tape ceramic sheets are stacked so that central and annular openings are aligned with each other. The central openings and annular openings are filled with conductive paste and the stacked green tape ceramic sheets are heated to cure the ceramic and conductive paste.

The method further comprises the step of laser drilling the holes and comprises the steps of forming the central holes and ceramic sheets that are stacked last a greater diameter to form a larger central electrode area to enhance conductor testing. The central openings can be formed as spiral openings after the green tape ceramic sheets are stacked to form a spiral configured central electrode after the conductive paste has been received within the central openings.

In still another method aspect of the invention, the sensor can be formed by forming a plurality of antenna element openings and a plurality of green tape ceramic sheets. Each antenna element opening comprises an annular opening. The successive green tape ceramic sheets are stacked so that the annular openings are aligned with each other. A central opening is then formed within each annular opening after the green tape ceramic sheets have been stacked. The central openings and annular openings are then filled with conductive paste and the stacked green tape ceramic sheets are heated to cure the green tape ceramic sheets and conductive paste. In this particular method, the central openings are formed after the green tape ceramic sheets have been stacked.

BRIEF DESCRIPTION OF THE DRAWINGS

Other objects, features and advantages of the present invention will become apparent from the detailed description of the invention which follows, when considered in light of the accompanying drawings in which:

FIG. 4a is a schematic, elevation view showing an array of four (4) antenna elements of the present invention that are to be passed over two parallel conductors.

FIG. 4b is a schematic plan view of four (4) antenna elements that are grouped together and showing those antenna elements passing over two parallel conductors.

DETAILED DESCRIPTION OF THE INVENTION

Figure 1:
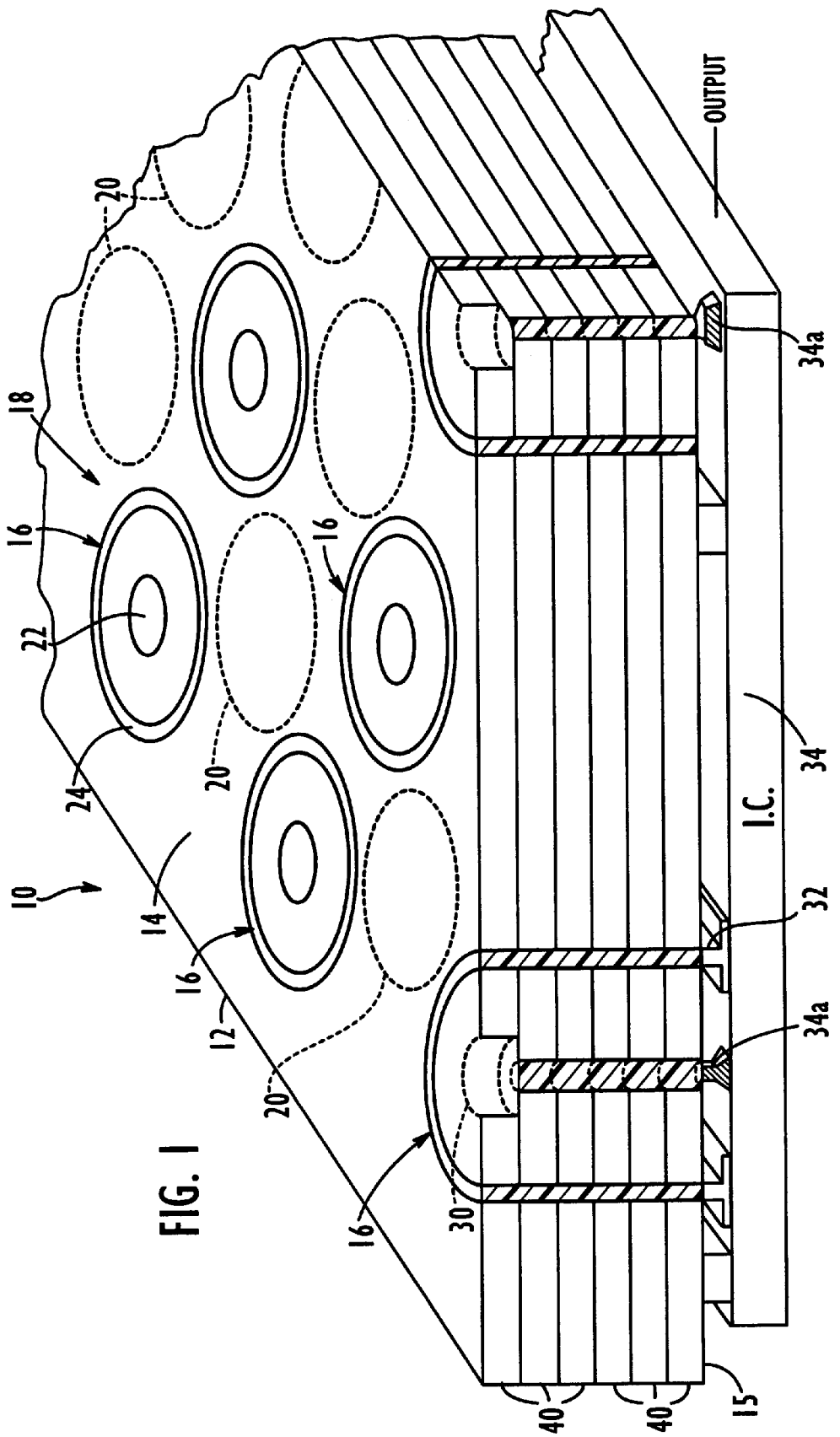
FIG. 1 is a perspective, partial sectional view of the apparatus of the present invention showing the array of antenna elements positioned in the ceramic sensor body and a signal processing integrated circuit mounted on the bottom of the sensor body.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete and will fully convey the scope of the invention to those skilled in the art. In the drawings, like numbers refer to like elements throughout.

The present invention is advantageous because it provides a sensor that non-intrusively determines signals in those conductors carrying various telecommunication signals, including digital communication signals, while also allowing for a device that is adapted for miniaturization and small scale use. The invention includes a plurality of antenna elements that are grouped together to form an antenna array. The antenna elements each comprise a central electrode and a surrounding shield electrode spaced from the central electrode. A signal processor, such as a signal processing integrated circuit, is connected to each antenna element for receiving the signal output from each antenna element and processing the received signals to determine the presence of signals passing through the conductors. By means of an appropriate processor, as well as other circuitry, it is also possible to determine the data signals passing through each conductor. A method of forming the sensor of the present invention is also disclosed.

Figure 2:
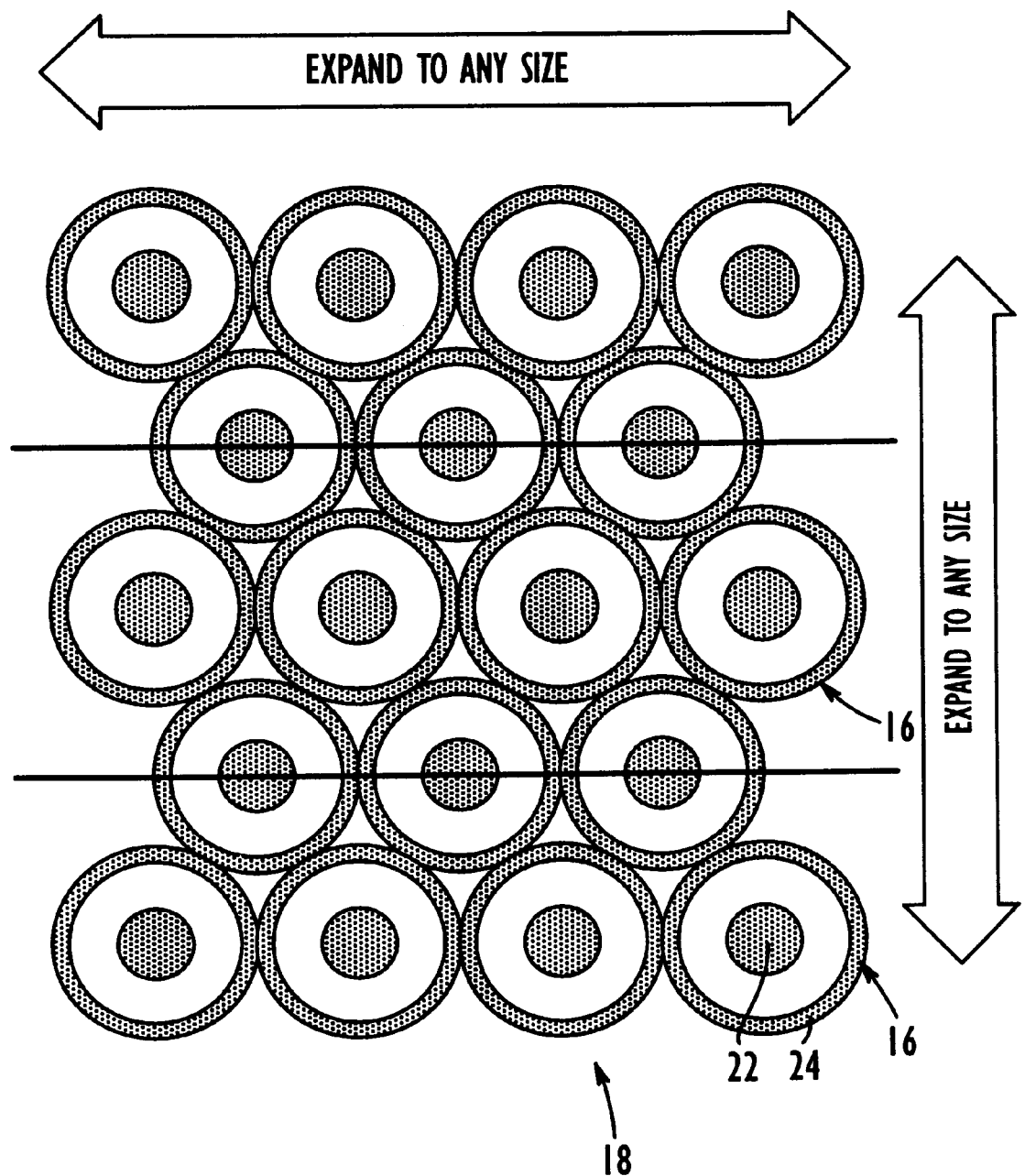
FIG. 2 is a top plan view of an array of antenna elements that are closely spaced and could be formed in the ceramic sensor body.

Referring now to FIGS. 1 and 2, there is illustrated an apparatus 10 of the present invention that is adapted for sensing signals on conductors 12, such as parallel conductors (FIG. 2). The apparatus is formed as a sensor and comprises a ceramic sensor body that is formed from a plurality of stacked sheets of ceramic green tape, which is then heated (or fired) to harden the ceramic. As will be explained in greater detail below, the use of ceramic green tape allows manufacturing of small scale sensors, such as in the present invention.

The ceramic sensor body 12 has a substantially planar sensor face 14 that is formed to be placed adjacent to the conductors to be sensed and an opposing circuit supporting end 15. A plurality of antenna elements 16 are formed in the ceramic sensor body 12 and each antenna element 16 is positioned in proximity to each other to form an antenna array 18. As shown in FIG. 2, the antenna elements 16 are closely spaced together, while in FIG. 1, the antenna elements are spaced a farther distance apart, leaving some gaps between antenna elements. Although the closely spaced antenna elements 16 of FIG. 2 would provide for a more exact measurement of the respective signals passing through a plurality of closely spaced, substantially parallel conductors, the layout shown in FIG. 1 is also possible as long as the parallel conductors to be sensed are not spaced closer than the respective distance between antenna elements, thus making cross-talk and signal differentiation difficult. The dotted lines 20 show the possible location of other antenna elements (FIG. 1) and correspond to the other antenna elements that could be included in the ceramic body to form antenna elements that are more closely spaced together, such as in FIG. 2.

Each antenna element 16 comprises a central electrode 22 and an annular-shaped, surrounding shield electrode 24 spaced from the central electrode 22. The central electrode 22 and surrounding shield electrode 24 are preferably formed from a hardened, conductive paste received in the ceramic sensor body before the heating step required to harden the ceramic as will be explained below. The conductive paste is of the type normally known to those skilled in the art. Each antenna element 16 includes respective first and second ends 26, 28 with the first end 26 of the central electrode 22 having an enlarged diameter portion 30 forming a signal sensing end (FIG. 1). The enlarged diameter portion 30 provides a greater area in which the electromagnetic energy produced by the signals flowing through a conductor can be received. Each surrounding shield electrode 24 is grounded, such as by a ground plate connection 32 located on the integrated circuit 34, which in turn is grounded by methods known to those skilled in the art. The central electrode 22 receives electromagnetic energy from the signals passing along the conductor.

As illustrated in FIG. 1, the ceramic sensor body 12 is initially formed from six (6) layers of green tape ceramic sheets 40, which are later cured by heating. Each green tape ceramic sheet 40 is about three mills thick and almost any number of sheets can be stacked together depending on the required size of the sensor body. Typically, each green tape ceramic sheet 40 can be silk screened before the sheets are stacked together with the other sheets. The silk screening can form any required circuitry necessary for operation of the sensor. The green tape ceramic sheets are initially in a soft state as compared to a hardened ceramic that has been fired, and thus, a laser can appropriately form annular and central openings which receive the conductive paste for forming the antenna elements. It is also possible that each green tape ceramic sheet could be pre-cut as long as there is some type of a support mechanism positioned under each sheet to hold the annular pieces having the central opening. This could be accomplished through various support mechanisms that back up against and support the green tape ceramic sheets. Thus, the cut annular pieces would not be moved relative to the overall green tape ceramic sheets, and would not lose their positioning relative to the overall green tape ceramic sheets.

Once the green tape ceramic sheets have been stacked together, the annular and central openings are filled with a conductive paste used to form the antenna elements of the present invention. For example, a conductive paste can be inserted over the top sheet of the stacked green tape ceramic sheets that form the sensor body, and a wiper blade can be moved back and forth thus forcing the conductive paste into the annular and central openings. In still another method of the present invention, the annular openings can first be formed in each separate green tape ceramic sheet, and then the green tape ceramic sheets stacked so that the annular openings align with each other. The central openings then can be formed such as by laser drilling. In still another method of the present invention, if the total number of stacked green tape ceramic sheets is small, it is possible to stack the sheets first and then cut the appropriate annular and central openings by laser or other appropriate means known to those skilled in the art.

Figure 3:
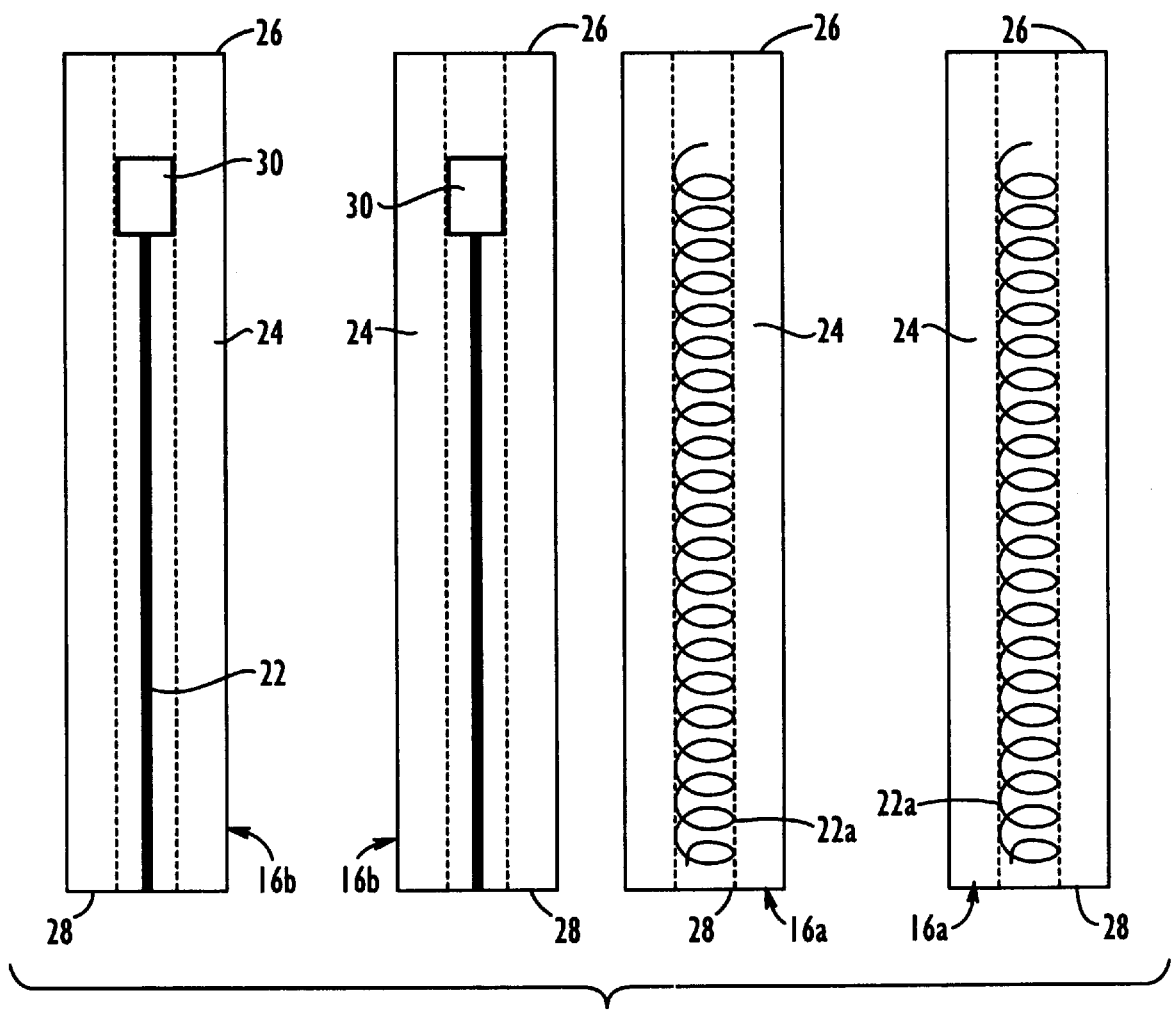
FIG. 3 is a schematic, side-elevation view of two different types of antenna elements showing straight and spiral central electrodes.
Figure 5:
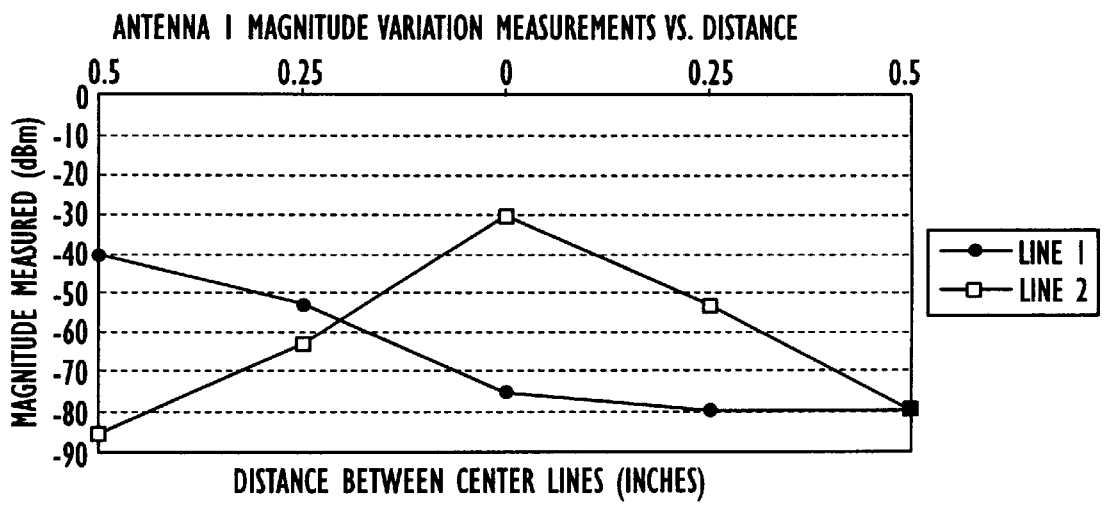
FIGS. 5–8 are graphs showing the magnitude variation measurements versus distances of the four (4) antenna elements of FIGS. 4a and 4b that pass $1/16"$ above the conductors.
Figure 6:
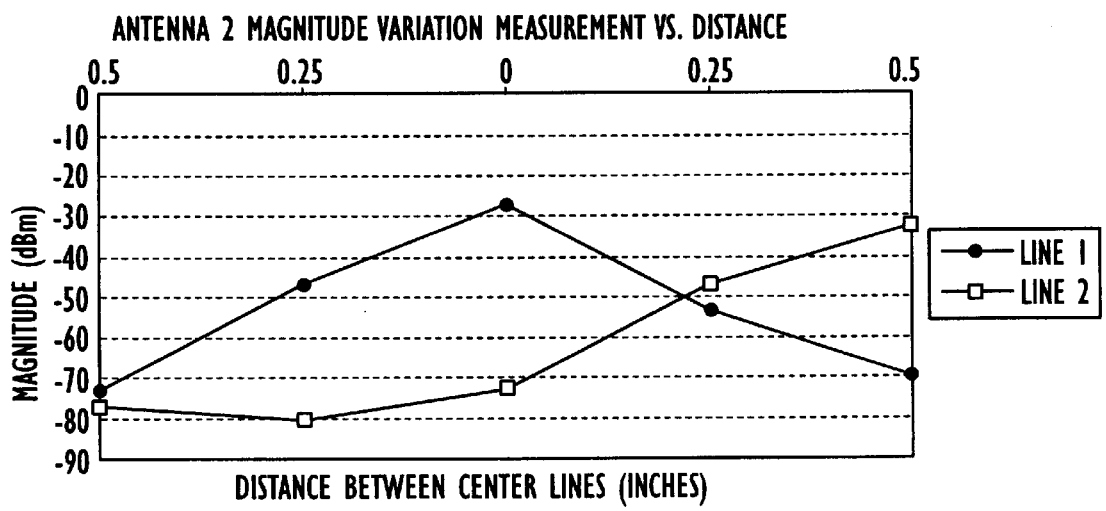
Figure 7:
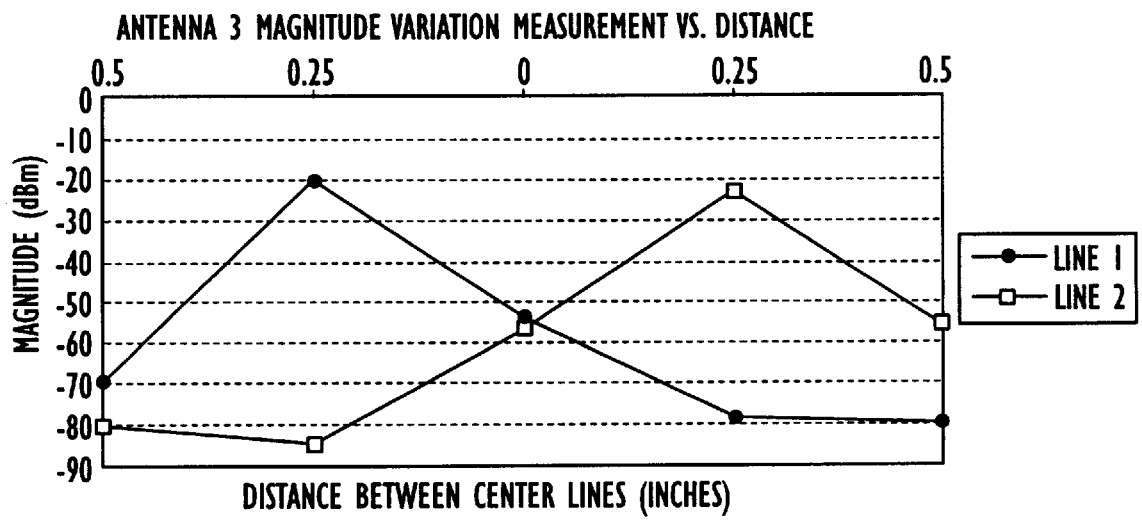
Figure 8:
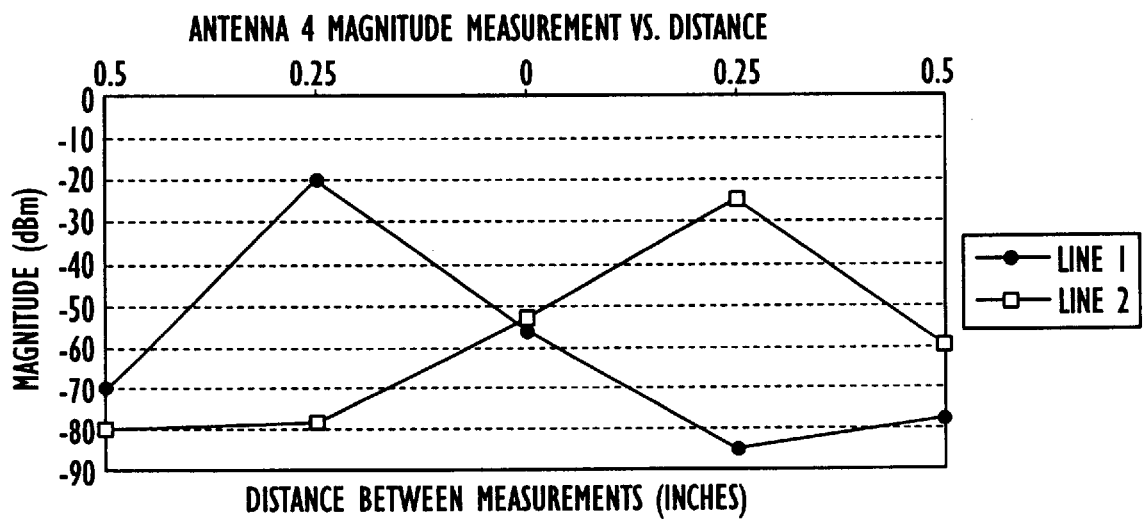
Figure 9:
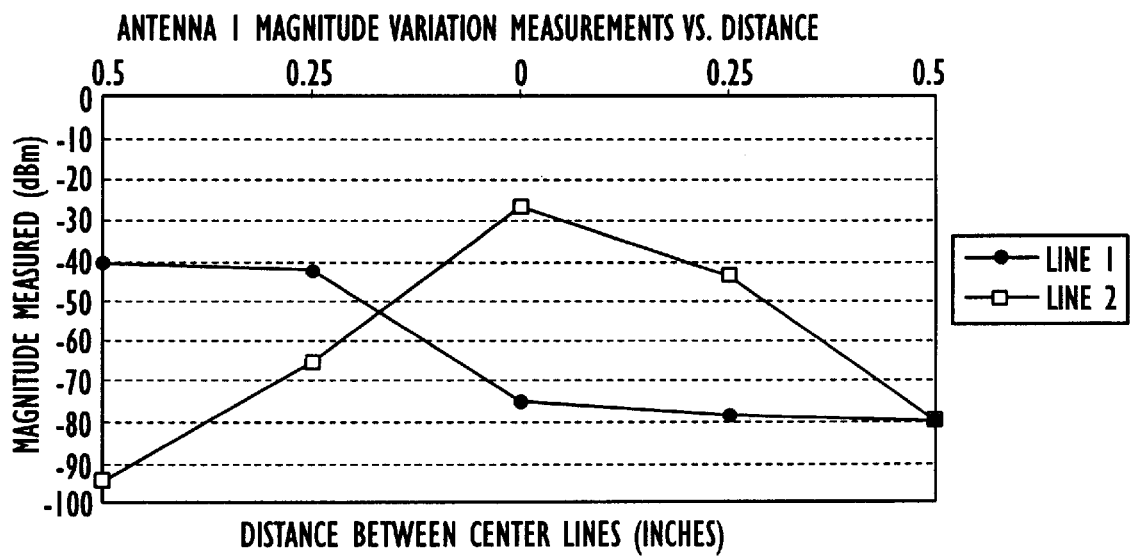
FIGS. 9–12 are graphs showing the magnitude variation measurements versus distances of the four (4) antenna elements of FIGS. 4a and 4b that pass $1/8"$ above the conductors.
Figure 10:
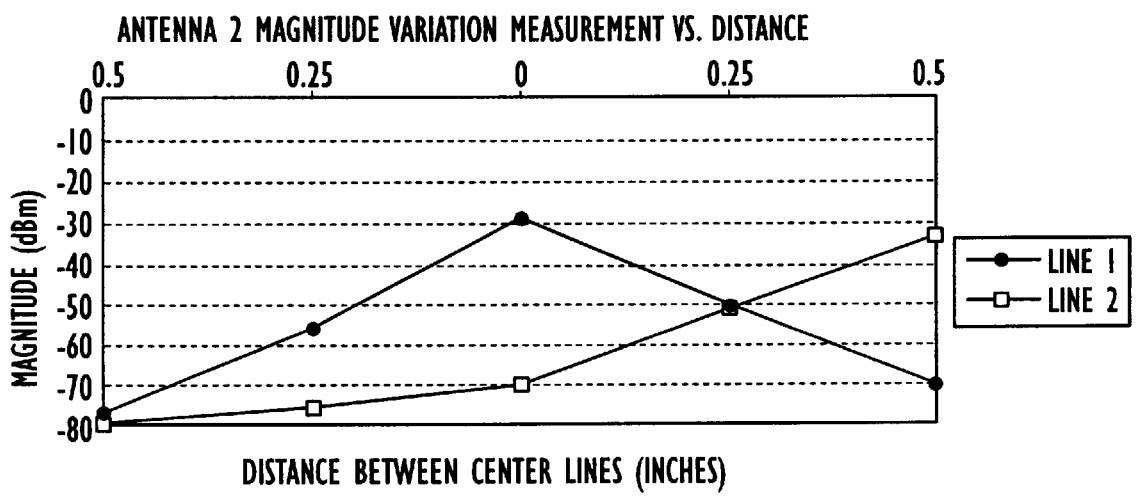
Figure 11:
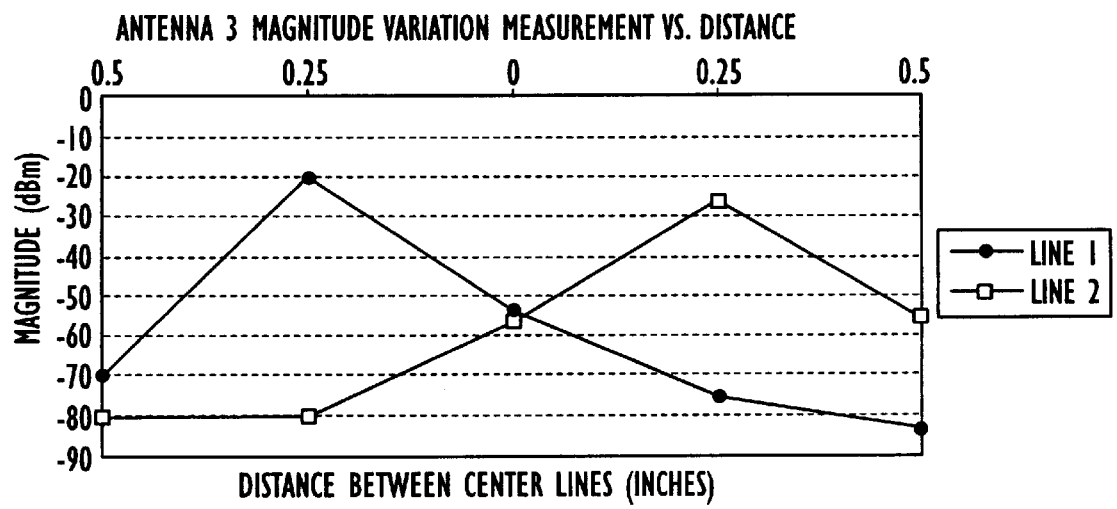
Figure 12:
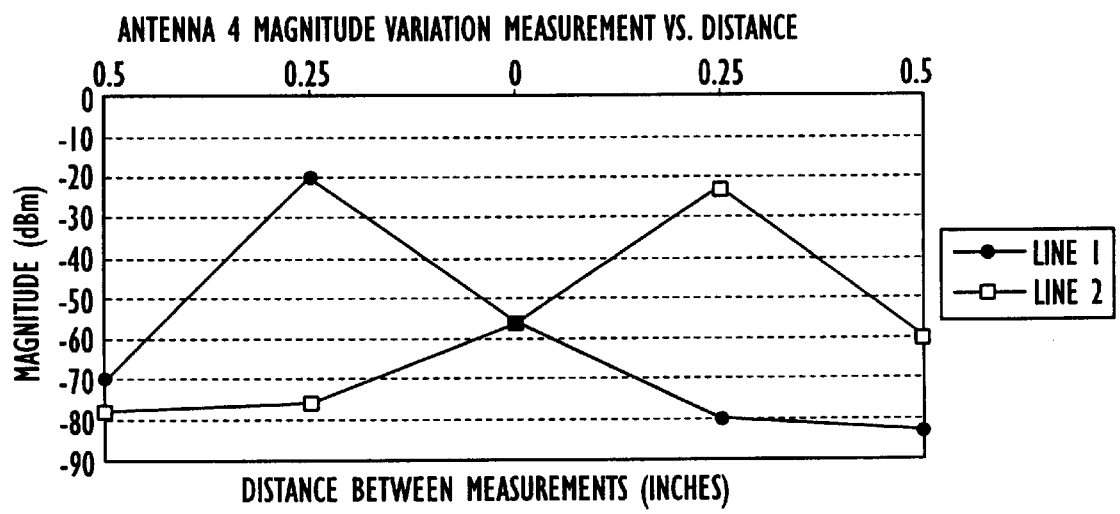
Figure 13:
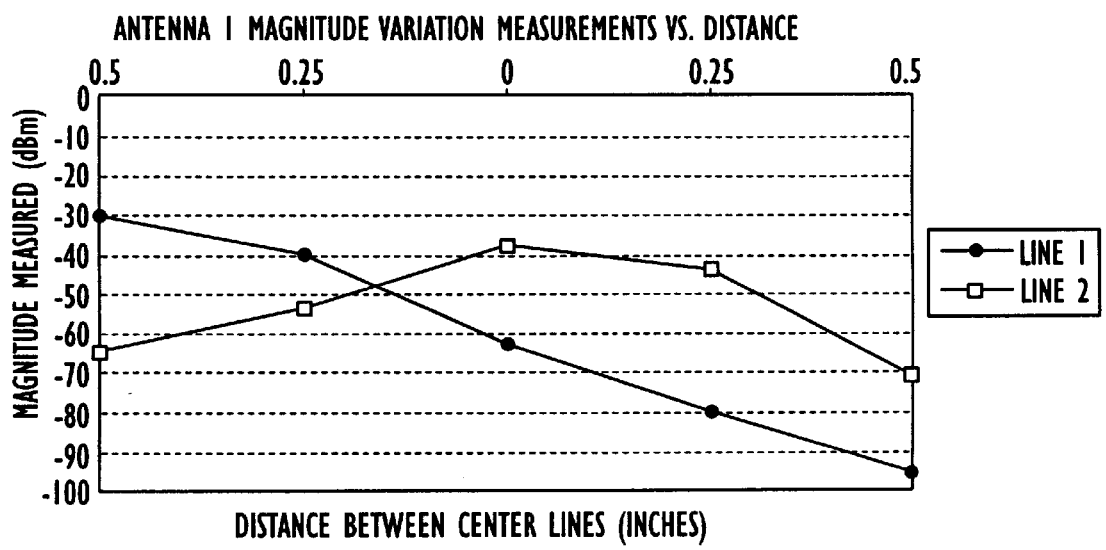
FIGS. 13–16 are graphs showing the magnitude variation measurements versus distance of the four (4) antenna elements of FIGS. 4a and 4b that pass $3/16"$ above the conductors.
Figure 14:
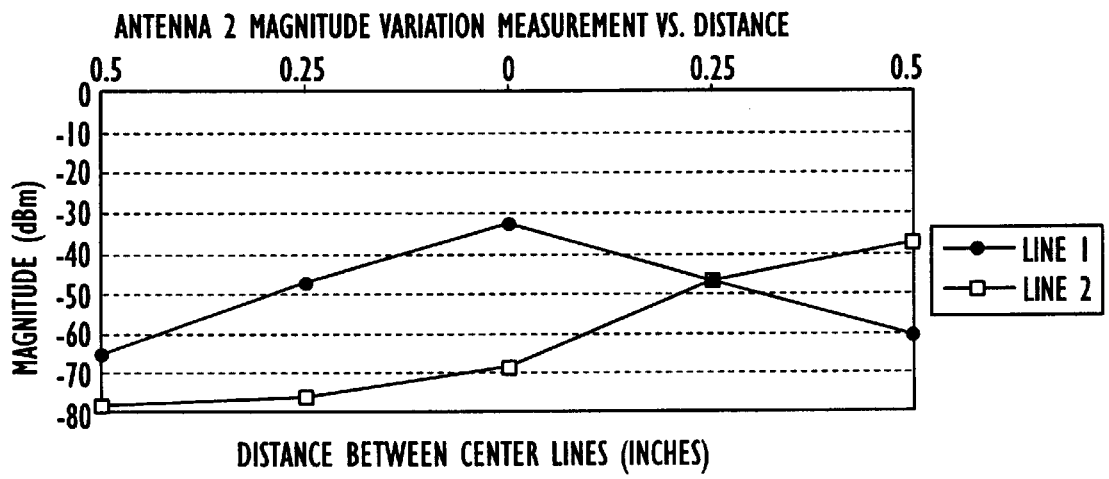
Figure 15:
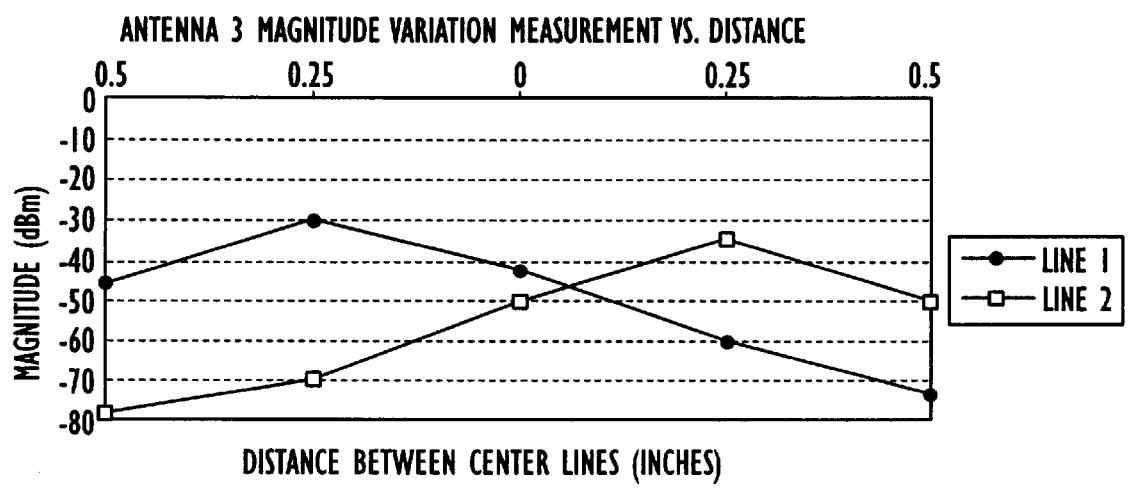
Figure 16:
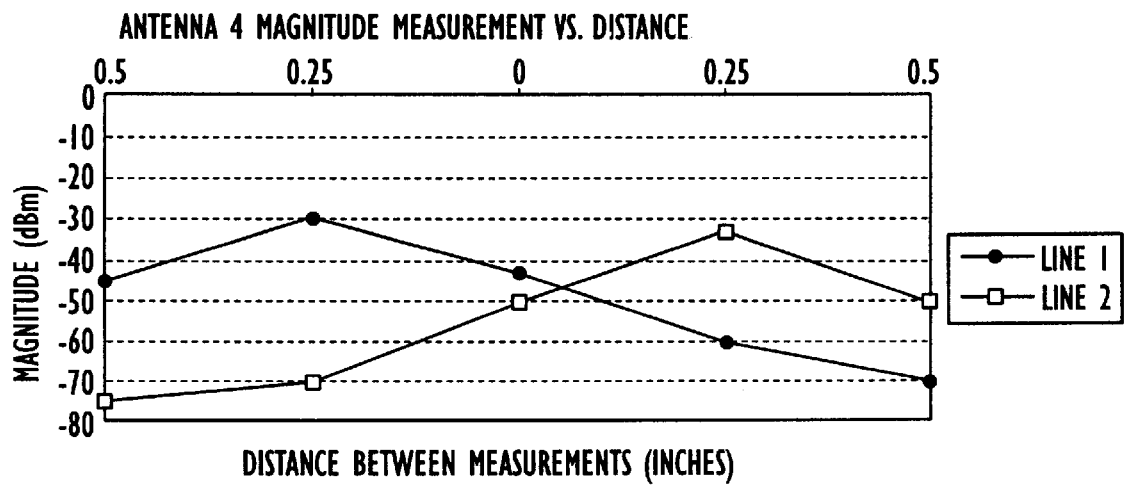
Figure 17:
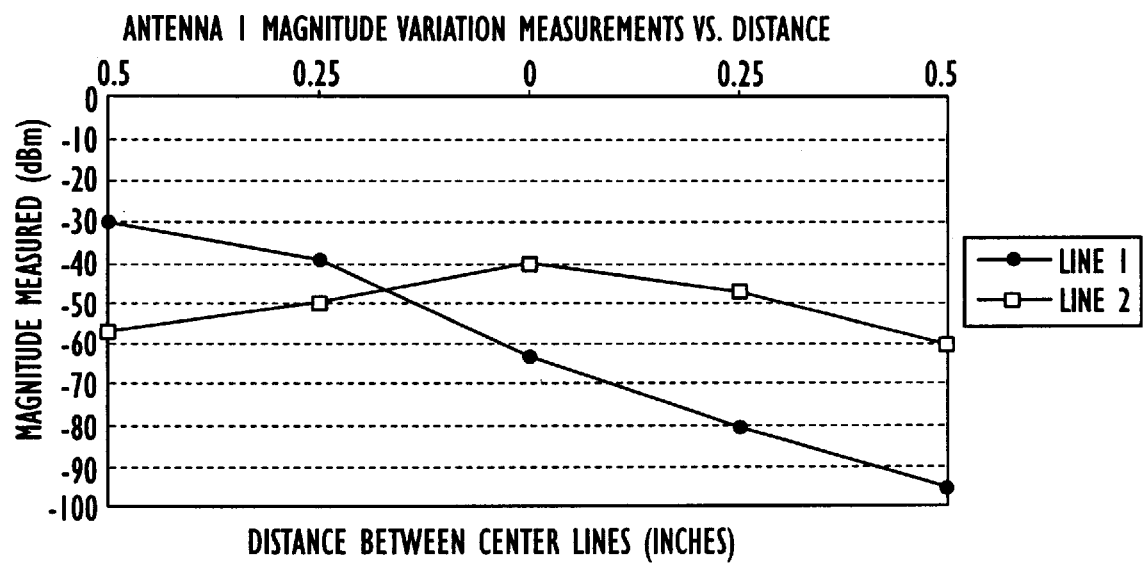
FIGS. 17–20 are magnitude variation measurements versus distance of the four (4) antenna elements of FIGS. 4a and 4b that pass $1/4"$ above the conductors.
Figure 18:
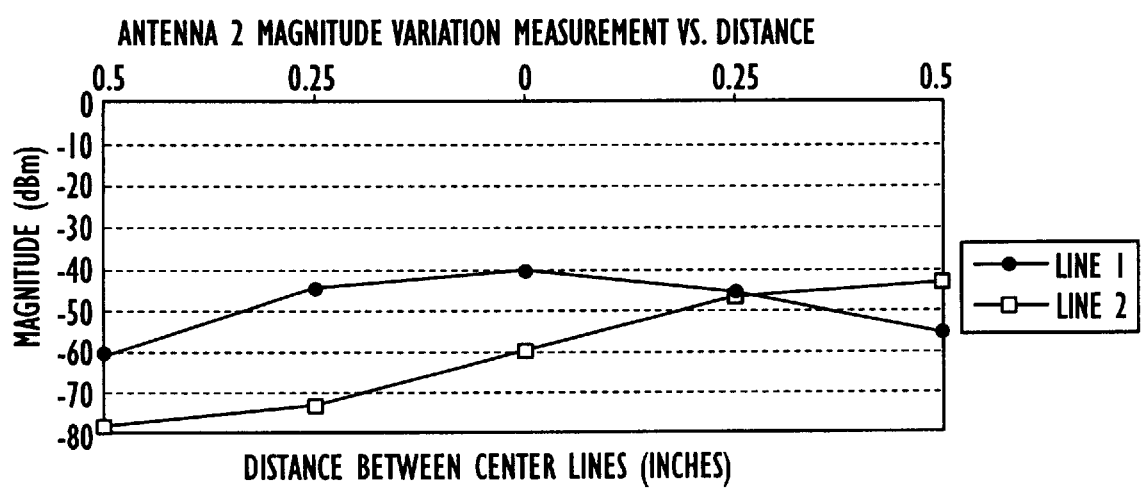
Figure 19:
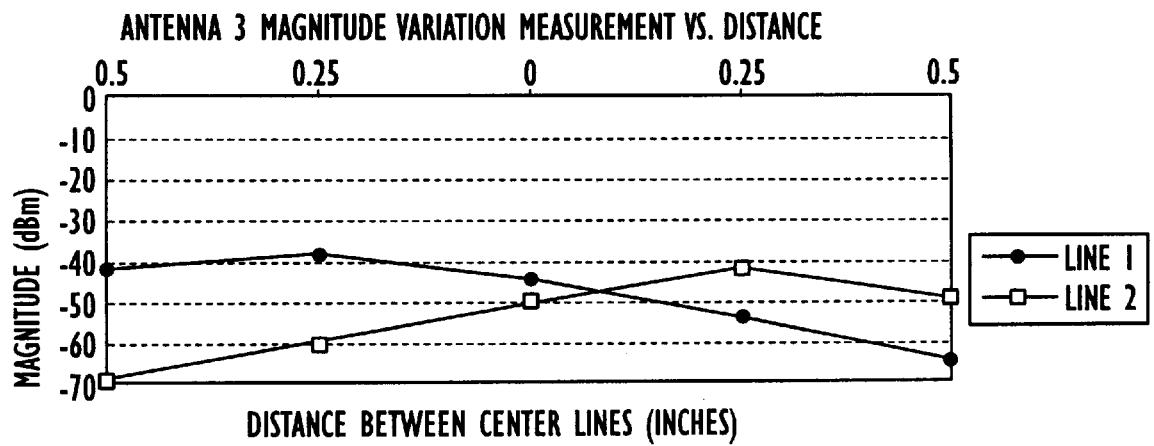
Figure 20:
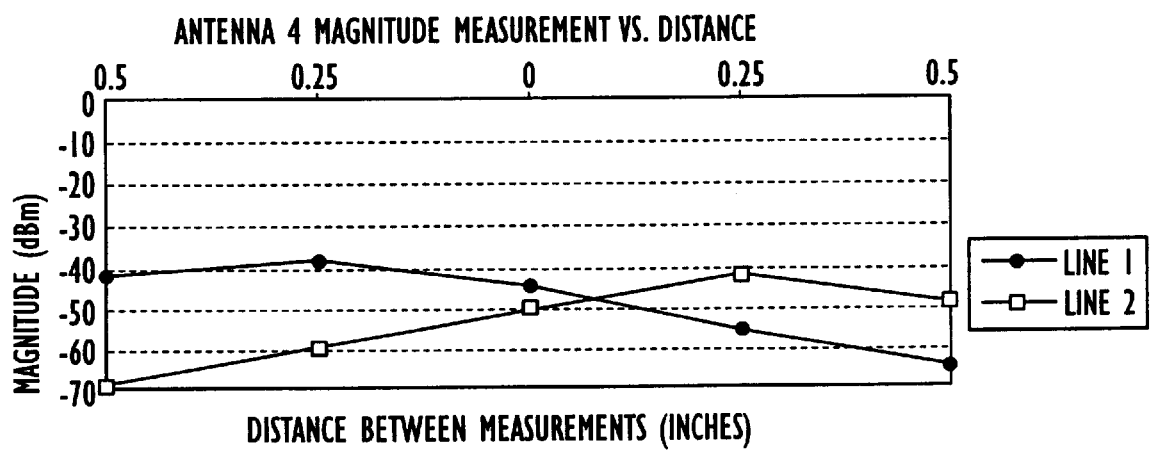

FIG. 3 illustrates two different embodiments of a central electrode contained in an outer shield 42, such as formed of copper. In the embodiment indicated at 16a, the central electrode 22 is configured as a spiral electrode 22a, which allows a greater antenna length to be inserted with the shield electrode, while increasing the area for sensing the electromagnetic energy generated by signals passing within a conductor. Spiral openings can be formed by stacking a plurality of green tape ceramic sheets that have offset central openings, such that when the central openings are aligned, a spiral configuration is formed. Thus, when the conductive paste is inserted within the spiral channel, a spiral central electrode is formed. The antenna element 16b shows a substantially straight central antenna element.

Once the green tape ceramic sheets have been stacked and the central and annular openings filled with the appropriate conductive paste, the product is then placed into an oven where it is fired, heating the green tape ceramic sheets and conductive paste to a curing temperature and forming a hard, durable ceramic sensor body 12. A signal processing integrated circuit 34 can be mounted on the rear side of the sensor body opposite the sensor face that is to be placed adjacent to the conductors to be sensed. Each central electrode is connected to the signal processing integrated circuit by appropriate circuit connection means 34a known to those skilled in the art. It is also possible in some instances, to place conductive epoxy bumps on the bottom of each central electrode to allow curing of the appropriate bumps or connectors on the integrated circuit. It is also possible in some instances, to use a conductive thermoplastic that would allow conduction to form an integrated circuit connected to the central electrode. The thermoplastic would act as a glue which can be elevated to a temperature to remove the integrated circuit if it needs to be replaced.

In operation, the antenna array 18 is moved over the conductor wires (C1, C2) to be sensed, and the signals are sensed through the antenna array. FIGS. 4a and 4b illustrate a test arrangement, using four (4) antenna elements that pass over two conductor wires at spaced distances for each test. FIG. 4b illustrates the four (4) antenna elements positioned in a diamond shape, which moves over the parallel conductors. Test results are shown in FIGS. 5–20. Test antennas 1–4 are illustrated in FIG. 4b, which shows the relative positioning of test antennas 1–4. The results from FIGS. 5–20 are only illustrative of the particular arrangement with four (4) antenna elements, with the antenna elements formed by a central conductor and outside copper shield, which is grounded, such as the type shown in FIG. 3. The graphs show the magnitude of the frequency, which is measured for each of the antennas. The distance between center lines is the distance from the central two antenna elements to the central distance between the two conductors. In FIGS. 5–8, the antenna array is positioned 1/16" above the conductors. In FIGS. 9–12, the antenna array is positioned 1/8" above the conductors; in FIGS. 13–16, 3/16" above the conductors; and in FIGS. 17–20, 1/4" above the conductors. It is evident from the graphs showing relative set signal strength that the sensor does pick up some amount of cross-talk, but the graphs show that it is possible to determine a signal by comparing several signals together through an appropriate processor.

The present invention is advantageous because the use of green tape ceramic sheets allows miniaturization of many antenna elements into one ceramic sensor body. If enough antenna elements are used, and the signal processing circuitry is advanced, it is possible not only to sense signals passing through conductors, but also to determine the data on each line. Thus, it is possible to determine the data that actually flows through the conductors, even without breaking the connection.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed and that the modifications of the embodiments are intended to be included within the scope of the dependent claims.

That which is claimed is:

1. An apparatus for sensing signals on conductors comprising:
   a ceramic sensor body;
   a plurality of antenna elements formed in the ceramic sensor body, wherein each antenna element includes a conductor sensing end and is positioned to each other to form an antenna array having a substantially planar sensor face that is to be placed adjacent to the conductors to be sensed, each of said antenna elements further comprising,
   a central electrode, and
   a surrounding shield electrode spaced from the central electrode; and
   signal processing means connected to each antenna element for receiving the signal output from each antenna element and processing the received signals for determining the presence of signals passing through the conductors.

2. An apparatus according to claim 1, wherein said central electrode and surrounding shield electrode are formed of a hardened, conductive paste received within the ceramic sensor body.

3. The apparatus according to claim 1, wherein said signal processing means further comprises a signal processing integrated circuit.

4. The apparatus according to claim 3 and further comprising means for mounting said signal processing integrated circuit on the sensor body.

5. The apparatus according to claim 4, wherein said sensor body further comprises a substantially planar mounting surface on which said signal processing integrated circuit is mounted.

6. The apparatus according to claim 1, wherein said central electrode of each antenna element includes first and second ends, wherein said first end has an enlarged diameter to be placed adjacent to the conductors to be sensed.

7. The apparatus according to claim 1, wherein said signal processing means further comprises a spectrum analyzer.

8. The apparatus according to claim 1, wherein said ceramic sensor body is formed from a plurality of green tape ceramic stacked sheets that have been cured by heating.

9. An apparatus according to claim 1, and further comprising means for grounding said surrounding shield electrode.

10. An apparatus according to claim 1, wherein said antenna elements are positioned in linear rows, with each row offset from each other.

11. An apparatus according to claim 1, wherein said central electrode is spiral configured.

12. An apparatus for sensing signals on conductors comprising:
   a ceramic sensor body having a substantially planar sensor face that is to be placed adjacent to the conductors to be sensed, and an opposing circuit supporting end;
   a plurality of antenna elements formed in the ceramic sensor body, wherein each antenna element is positioned to form an antenna array, wherein each antenna element has a signal sensing end positioned at the planar sensor face for sensing signals on conductors, each of said antenna elements further comprising,
   a central electrode, and
   a surrounding shield electrode spaced from the central electrode; and
   signal processing means mounted on the circuit supporting end of said sensor body and connected to each antenna element for receiving the signal output from each antenna element and processing the received signals for determining the presence of signals passing through the conductors.

13. The apparatus according to claim 12, wherein said central electrode and said surrounding shield electrode are formed of a hardened, conductive paste received within the ceramic sensor body.

14. The apparatus according to claim 12, wherein said signal processing means further comprises a signal processing integrated circuit.

15. The apparatus according to claim 12, wherein said central electrode of each antenna element includes first and second ends, said first end having an enlarged diameter at the signal sensing end of said antenna element.

16. The apparatus according to claim 12, wherein said sensor body is formed from a plurality of green tape ceramic stacked sheets that have been cured by heating.

17. An apparatus according to claim 12 and further comprising means for grounding said surrounding shield electrode.

18. An apparatus according to claim 12, wherein said antenna elements are positioned in linear rows, with each row offset from each other.

19. An apparatus according to claim 12, wherein said central electrode is spiral configured.

20. An apparatus for sensing signals on conductors comprising:
 a plurality of antenna elements positioned to form an array that is to be placed adjacent to the conductors to be sensed, each antenna element further comprising,
  a central electrode, and
  a surrounding shield electrode spaced from the central electrode; and
 at least one signal processing integrated circuit connected to said antenna elements for receiving the signal output from each antenna element and processing the received signals for determining the presence of signals passing through the conductors.

21. The apparatus according to claim 20 and further comprising means for mounting said signal processing integrated circuit on the formed array and means connecting said signal processing integrated circuit to each of the antenna elements.

22. The apparatus according to claim 20, wherein said central electrode of each antenna element includes first and second ends, said first end having an enlarged diameter to be placed adjacent to the conductors to be sensed.

23. The apparatus according to claim 20, wherein said signal processing means further comprises a spectrum analyzer.

24. The apparatus according to claim 20 and further comprising a ceramic sensor body, and wherein each of said antenna elements is formed from a hardened, conductive paste received within said ceramic sensor body.

25. The apparatus according to claim 24, wherein said ceramic sensor body is initially formed from a plurality of green tape ceramic stacked sheets.

26. The apparatus according to claim 20, wherein said central electrodes and surrounding shield electrodes have ends forming a substantially coplanar face that is to be positioned adjacent to the conductors to be sensed.

27. An apparatus according to claim 20 and further comprising means for grounding said surrounding shield electrode.

28. An apparatus according to claim 20, wherein said antenna elements are positioned in linear rows, with each row offset from each other.

29. An apparatus according to claim 20, wherein said central electrode is spiral configured.

30. A sensor for sensing signals on conductors comprising:
 a ceramic sensor body;
 a plurality of antenna elements formed in the ceramic sensor body, wherein each antenna element is positioned to form an array and has a conductor sensing end forming a substantially coplanar sensor face that is to be placed adjacent to the conductors to be sensed, said antenna elements further comprising,
  a central electrode, and
  a surrounding shield electrode spaced from the central electrode.

31. A sensor according to claim 30, wherein said central electrode and surrounding shield electrode are formed of a hardened, conductive paste received within the ceramic sensor body.

32. A sensor according to claim 30 and further comprising means for connecting each of said antenna elements to a signal processor for forwarding the signal output from each antenna element to a signal processor to determine the presence of signals passing through the conductors.

33. A sensor according to claim 30, wherein said sensor body further comprises means for mounting a signal processing integrated circuit.

34. A sensor according to claim 30, wherein said central electrode of each antenna element includes first and second ends, said first end having an enlarged diameter to be placed adjacent to the conductors to be sensed.

35. A sensor according to claim 30, wherein said ceramic sensor body is formed from a plurality of green tape ceramic stacked sheets that are initially secured together and cured by heating.

36. A sensor according to claim 30, wherein said central electrode and surrounding shield electrode have ends forming a substantially coplanar face that is to be positioned adjacent to the conductors to be sensed.

37. A sensor according to claim 30 and further comprising means mounted on said sensor body for grounding said surrounding shield electrode.

38. A sensor according to claim 30, wherein said antenna elements are positioned in linear rows, with each row offset from each other.

39. A sensor according to claim 30, wherein said central electrode is spiral configured.

40. A sensor for sensing signals on conductors comprising:
 a ceramic sensor body;
 a plurality of antenna elements formed in the ceramic sensor body, wherein each antenna element is positioned to form an array and has a conductor sensing end that is to be placed adjacent to the conductors to be sensed, said antenna elements further comprising,
  a central electrode, and
  a surrounding shield electrode spaced from the central electrode; and
  means for connecting each of said antenna elements to a signal processor to determine the presence of signals passing through the conductors.

41. A sensor according to claim 40, wherein said central electrode and surrounding shield electrode are formed of a hardened, conductive paste received within the ceramic sensor body.

42. A sensor according to claim 40, wherein said sensor body further comprises means for mounting a signal processing integrated circuit.

43. A sensor according to claim 40, wherein said central electrode of each antenna element includes first and second ends, said first end having an enlarged diameter to be placed adjacent to the conductors to be sensed.

44. A sensor according to claim 40, wherein said signal processing means further comprises a spectrum analyzer.

45. A sensor according to claim 40, wherein said ceramic sensor body is formed from a plurality of green tape ceramic stacked sheets that are initially secured together and cured by heating.

46. A sensor according to claim 40, wherein said central electrode and surrounding shield electrode have ends forming a substantially coplanar face that is to be positioned adjacent to the conductors to be sensed.

47. A sensor according to claim 40 and further comprising means mounted on said sensor body for grounding said surrounding shield electrode.

48. A sensor according to claim 40, wherein said antenna elements are positioned in linear rows, with each row offset from each other.

49. A sensor according to claim 40, wherein said central electrode is spiral configured.

50. A method for sensing signals on conductors comprising the steps of:

passing a plurality of antenna elements over the conductors to be sensed, wherein each of the antenna elements are positioned to form an array, and have a central electrode and surrounding electrode;

receiving the signal output within a signal processor from each antenna element as the antenna elements pass over the conductors; and processing the received signal output from each antenna element to determine the presence of signals passing through the conductors.

51. A method of claim 50 and further comprising the step of correlating the processed signal output from each antenna element to determine the data passing through each conductor.

* * * * *